United States Patent
Kern et al.

(10) Patent No.: US 12,483,276 B2
(45) Date of Patent: Nov. 25, 2025

(54) ERROR DETECTION

(71) Applicant: Infineon Technologies AG, Neubiberg (DE)

(72) Inventors: Thomas Kern, Aschheim (DE); Alexander Klockmann, Taufkirchen (DE); Michael Goessel, Mahlow (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/424,922

(22) Filed: Jan. 29, 2024

(65) Prior Publication Data
US 2024/0257893 A1 Aug. 1, 2024

(30) Foreign Application Priority Data
Jan. 31, 2023 (DE) .................. 10 2023 102 337.3

(51) Int. Cl.
| | | |
|---|---|---|
| *H03M 13/37* | (2006.01) | |
| *G11C 29/42* | (2006.01) | |
| *H03M 13/00* | (2006.01) | |
| *H03M 13/51* | (2006.01) | |

(52) U.S. Cl.
CPC ......... *H03M 13/3738* (2013.01); *G11C 29/42* (2013.01); *H03M 13/51* (2013.01); *H03M 13/6505* (2013.01)

(58) Field of Classification Search
CPC ......... G11C 29/42; G11C 29/52; G06F 11/10; G06F 11/1012; H03M 13/6502; H03M 13/6505; H03M 13/3738; H03M 13/51
See application file for complete search history.

(56) References Cited

U.S. PATENT DOCUMENTS

| | | | | |
|---|---|---|---|---|
| 6,005,727 | A | * | 12/1999 | Behrens ............... G11B 5/553 |
| 9,252,816 | B1 | * | 2/2016 | Steiner ............. H03M 13/2909 |
| 9,805,771 | B2 | | 10/2017 | Loibl et al. |
| 9,954,556 | B2 | * | 4/2018 | Kumar ............. H03M 13/3746 |
| 10,218,388 | B2 | * | 2/2019 | Lin .................. H03M 13/2963 |
| 10,326,477 | B2 | * | 6/2019 | Kumar ............. H03M 13/2945 |

(Continued)

FOREIGN PATENT DOCUMENTS

WO 2018039156 A1 3/2018

OTHER PUBLICATIONS

O. U. Rehman and N. Živić, "Soft input decoding of Reed Solomon Codes with miscorrection detection and avoidance," 2010 4th International Conference on Signal Processing and Communication Systems, Gold Coast, QLD, Australia, 2010.*

(Continued)

*Primary Examiner* — Steve N Nguyen
(74) *Attorney, Agent, or Firm* — Eschweiler & Potashnik, LLC

(57) ABSTRACT

Solutions are proposed related to error detection wherein (i) each byte of a second byte sequence is determined as a function of at least one byte of a first byte sequence, (ii) a byte of the second byte sequence is impermissible if it is not equal to an assigned byte of the first byte sequence and if no error of a predefined error set corrupts this byte to the assigned byte of the first byte sequence, and (iii) at least one error is detected if the second byte sequence is impermissible, the second byte sequence being impermissible if at least one byte of the second byte sequence is impermissible.

19 Claims, 3 Drawing Sheets

(56) References Cited

U.S. PATENT DOCUMENTS

| | | | |
|---|---|---|---|
| 10,353,770 B2* | 7/2019 | Lee | G11C 29/42 |
| 10,599,514 B2 | 3/2020 | Jalan et al. | |
| 2011/0161779 A1* | 6/2011 | Otsuka | H03M 13/2906 |
| | | | 711/E12.001 |
| 2012/0317463 A1* | 12/2012 | Sugahara | H03M 13/05 |
| | | | 714/E11.032 |
| 2014/0351672 A1* | 11/2014 | Marrow | H03M 13/453 |
| | | | 714/764 |
| 2016/0357466 A1* | 12/2016 | Vanhall | H03M 13/1515 |
| 2017/0179980 A1* | 6/2017 | Lin | H03M 13/451 |
| 2017/0194989 A1* | 7/2017 | Kumar | H03M 13/29 |
| 2018/0006662 A1* | 1/2018 | Gho | H04L 1/201 |
| 2019/0102248 A1* | 4/2019 | Vanaparthy | G06F 11/1004 |
| 2019/0312601 A1 | 10/2019 | Kern et al. | |
| 2021/0194506 A1* | 6/2021 | Symons | H03M 13/19 |

OTHER PUBLICATIONS

Prentice Hall, 1989, Sieten 110 and 111. "Error Control Coding for Computer Systems." Published in 1989.

* cited by examiner

ERROR DETECTION

REFERENCE TO RELATED APPLICATIONS

This application claims priority to German Patent Application 10 2023 102 337.3, filed on Jan. 31, 2023. The contents of the above-referenced patent application is hereby incorporated by reference in its entirety.

BACKGROUND

Solutions are provided for improved error detection in particular in respect of memory errors.

SUMMARY

One object is to improve known approaches for error detection. This object is achieved according to the features of the independent claims. Preferred embodiments can be gathered from the dependent claims, in particular. These examples proposed herein may be based on at least one of the solutions below. In particular, combinations of the features below may be used to achieve a desired result. The features of the method may be combined with (any) arbitrary feature(s) of the device or computer program product, or vice versa.

For the solution, a method for error detection is proposed, wherein each byte of a second byte sequence is determined as a function of at least one byte of a first byte sequence, wherein a byte of the second byte sequence is impermissible if it is not equal to an assigned byte of the first byte sequence and if no error of a predefined error set corrupts this byte to the assigned byte of the first byte sequence, wherein at least one error is detected if the second byte sequence is impermissible, the second byte sequence being impermissible if at least one byte of the second byte sequence is impermissible.

It should be noted here that a byte i of the first byte sequence is assigned for example to a byte i of the second byte sequence, i.e. according to the order of the bytes in the respective byte sequence the succession and hence assignment thereof are determined.

In one aspect, each byte of the second byte sequence is determined as a function of at least one byte of the first byte sequence using the byte of the first byte sequence that is assigned to the second byte.

In one aspect, each byte of the second byte sequence is determined as a function of at least one byte of the first byte sequence on the basis of an error code, in particular a byte error code.

In one aspect, the second byte sequence is determined as a first byte sequence corrected using the error code.

In one aspect, the first byte sequence is a sequence of n-bit bytes which is transformed into a sequence of k-bit bytes by means of a transformation $T^{-1}$, the sequence of k-bit bytes is corrected to a corrected sequence of k-bit bytes using the error code, the corrected sequence of k-bit bytes is transformed into the second byte sequence by means of a transformation T, each byte of the second byte sequence comprising n bits and each byte of the second byte sequence being a code word of a further error code, in the error-free bytes of the first byte sequence there are code words of the further error code, wherein the transformation $T^{-1}$ transforms a code word of the further error code into that k-bit byte which is transformed into the code word of the further error code by means of the transformation T.

In one aspect, the further error code is an m-out-of-n code.

In one aspect, the transformation $T^{-1}$ is determined such that it transforms an n-bit byte which is not a code word of the further error code into a predefined k-bit byte.

In one aspect, the predefined k-bit byte is the byte $$\underbrace{0, \ldots, 0}_{k}$$

In one aspect, a byte of the second byte sequence is impermissible if the difference between the number of ones of a byte of the first byte sequence and the number of ones of the corresponding byte of the second byte sequence is an even number not equal to zero.

In one aspect, a byte of the second byte sequence is impermissible if the difference between the number of ones of a byte of the first byte sequence and the number of ones of the corresponding byte of the second byte sequence is at most R where R≥1.

In one aspect, the error set is a set of unidirectional errors.

In one aspect, the error set comprises errors in which at least one bit of a byte is erroneous.

In one aspect, the first byte sequence comprises bytes which are code words of an m-out-of-n code, where m≤n and n≥2.

A device for error detection is also proposed, including a processing unit which is configured in such a way that the method as described in the present case is able to be carried out.

The device can be embodied as a circuit arrangement. The device can comprise parts of an integrated circuit or memory chip or can be embodied separately with respect thereto.

Furthermore, a device for error detection is specified, including a corrector and a checking unit. The corrector is configured to read data from a memory as a first byte sequence and to determine a corrected byte sequence, which can be a false correction, on the basis of the data read. The checking unit is configured to, on the basis of the corrected byte sequence and the first byte sequence, determine whether a false correction is present. The checking unit is configured determine a byte of a second byte sequence as a function of at least one byte of a first byte sequence, determine a byte of the second byte sequence as impermissible if it is not equal to an assigned byte of the first byte sequence and if no error of a predefined error set corrupts this byte to the assigned byte of the first byte sequence, and detect an error if the second byte sequence is impermissible if at least one byte of the second byte sequence is impermissible.

In one aspect, the checking unit comprises an encoder having an input and an output and a comparator having two inputs and an output, wherein the input of the encoder is connected to the output of the corrector, wherein the output of the encoder is connected to the first input of the comparator. The first byte sequence is present at the second input of the comparator, wherein on the basis of the output of the comparator it is possible to determine whether the second byte sequence is impermissible, wherein the corrector is configured by means of a decoder in such a way that the n-bit bytes of the first byte sequence are transformed into a sequence of k-bit bytes by means of a transformation $T^{-1}$, and that the sequence of k-bit bytes is corrected to the corrected sequence of k-bit bytes using an error code. The encoder is configured in such a way that the corrected sequence of k-bit bytes is transformed into the second byte sequence by means of a transformation T, wherein each byte of the second byte sequence comprises n bits and each byte of the second byte sequence is a code word of a further error code. The transformation $T^{-1}$ transforms a code word of the further error code into that k-bit byte which is transformed into the code word of the further error code by means of the transformation T. The comparator is configured for determining whether the second byte sequence is permissible, wherein the second byte sequence is permissible if the bytes of the first byte sequence are code words of the further error code, wherein at the output of the comparator information is present on the basis of which it is possible to determine whether or not the second byte sequence was determined as permissible.

Furthermore, a computer program product is proposed which is directly loadable into a memory of a digital computer, comprising program code parts configured to carry out steps of the method described here.

The above-described properties, features and advantages of this invention and the way in which they are achieved are described below in association with a schematic description of exemplary embodiments which are explained in greater detail in association with the drawings.

BRIEF DESCRIPTION OF THE DRAWINGS

In this case, identical or identically acting elements may be provided with identical reference signs for the sake of clarity.

DETAILED DESCRIPTION

Figure 1:
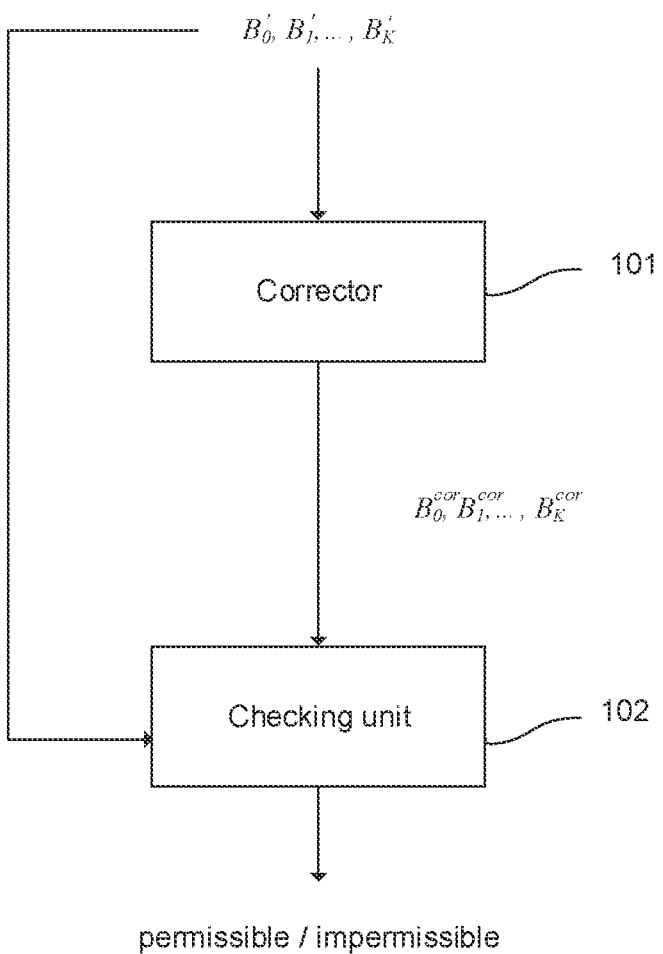
FIG. 1 shows a schematic diagram an example of false correction detection, in accordance with various aspects disclosed.

When storing data in memory cells, when reading out the data or when transferring data, errors may occur. In order to improve freedom from errors for the data, error codes can be used. An error code is a code which can detect errors or detect and correct errors.

The data may comprise payload data and check data. The data are present in bytes, where each byte comprises q bits ($q \geq 1$). The byte comprising q bits may also be referred to as a q-bit byte. In particular, the notation that data contain data bytes and optionally also check bytes is used below.

Embodiments below relate in particular to data grouped as q-bit bytes.

When storing the data in memory cells, if the data bytes are supplemented by check bytes, additional memory cells are also required for the check bytes. Minimizing the amount of check bytes is often an aim so that the greatest possible proportion of the memory can be used for the payload data.

A byte error is an error which leads to at least one erroneous bit within the byte. If a byte has q bits and if q equals 1, then the byte error corresponds to a 1-bit error which corrupts the one bit of the byte. If the byte has q bits and if $q \geq 2$, then 1 bit to a maximum of q bits may be erroneous in a byte error.

By way of example, it is proposed to improve error detection in a sequence of bytes without the need for additional check bytes.

For a first byte and a second byte, a check is made to ascertain whether the second byte is a permissible byte. In this case, the second byte is referred to as permissible either if it is equal to the first byte or if there is an error of an error set which corrupts the second byte to the first byte.

By way of example, a first sequence of bytes may have errors and a second sequence of bytes can be determined using an error code. In this case, the second sequence of bytes arises on the basis of the first sequence of bytes.

In particular, the second sequence can form a code word of an error code to which the sequence of first bytes was corrected using the error code.

The second sequence then comprises corrected bytes and the corrected bytes of the second sequence can be compared with the corresponding bytes of the first sequence. In particular, it can be established whether the corresponding bytes of the second sequence and of the first sequence differ in terms of an error of the error set. If two bytes to be compared are unequal and if they do not differ in terms of an error of the error set after the correction with the first error code, then no error of the error set has been corrected, and the corrected byte is an impermissible byte. Although in this case a code word is determined by the first error code, no error of the error set is corrected. A false correction with regard to the error set is thus detected.

Such a situation may occur for example if a multi-byte error has occurred with a number of erroneous bytes which is greater than the correction possibility of the first error code. An erroneous correction of at least one byte may occur in this case. This is also referred to as false correction: although the error code carries out a correction and yields a code word, the latter is not correct.

Examples described herein make it possible to detect such a false correction. It is recognized that a byte is impermissible and that no error of the error set was corrected. Advantageously, no additional check byte is required for this purpose.

Optionally, an error-free byte of the first byte sequence may be a code word of a second error code, for example a code word of an m-out-of-n code, such that each error-free byte has m ones and n-m zeros, where $0 \leq m \leq n$ and $n > 1$. The first byte sequence has n-bit bytes which are code words of the m-out-of-n code in the error-free case. In the error case, a byte of the first byte sequence may have been corrupted to an n-bit byte having m+1 ones, for example.

The second byte sequence can have corrected bytes which are likewise code words of the m-out-of-n code. A comparison of the n-bit bytes of the second byte sequence with the corresponding bytes of the first byte sequence makes it possible to determine whether the bytes differ in terms of an error of the error set. The second byte sequence can be determined using a transformation and the inverse transformation with respect thereto, and using the first error code. The first byte sequence of n-bit bytes can be transformed by the inverse transformation into a byte sequence of k-bit bytes, which is corrected with the first error code. This byte sequence corrected with the first error code can be transformed by the transformation into the second byte sequence of n-bit bytes, the n-bit bytes forming m-out-of-n code words. A check is then made to ascertain whether a byte of the second byte sequence is a permissible byte: this is done by checking whether there is an error of the error set by which the byte of the second byte sequence and the corresponding byte of the first byte sequence differ. By way of example, a check is made to ascertain whether there is an error of the error set which corrupts the byte of the second byte sequence to the corresponding byte of the first byte sequence. Two cases can be differentiated here: if there is such an error of the error set and the erroneous byte of the first byte sequence and the corresponding corrected byte of the second byte sequence differ in terms of the error of the error set, then the corrected byte is permissible; and if there is no such error, then the corrected byte, i.e. the second byte sequence, is impermissible: there is then no error of the error set by which the byte of the first byte sequence and the corresponding byte of the second byte sequence then differ. A false correction is present.

It is also an option that the second sequence is determined by a transformation of bytes of a code word of the error code.

If a second byte is determined as a permissible byte, then either it is equal to the corresponding first byte or there is an error from the error set which corrupts the corrected byte to the first byte.

The corrected byte and the erroneous byte differ here by an error of the error set. It is possible to check whether an error of the error set was corrected.

An error of the error set may thus have been corrected using the error code. A corrected byte is referred to as permissible here if there is an error from the error set which corrupts the corrected byte to the erroneous byte.

A second byte is referred to as an impermissible byte if there is no error of the error set which corrupts the second byte to the first byte. If that is the case, then no error of the error set was corrected using the error code.

A byte sequence having an (at least one) impermissible byte is referred to as an impermissible byte sequence. The impermissible byte sequence can be determined as erroneous.

By way of example, if a second byte sequence is determined from a first byte sequence using an error code, such that the second byte sequence is a code word of the error code, and if the byte sequence thus determined is impermissible, then there is no error of the error set by which the second byte sequence differs from the first byte sequence. No error of the error set may have been corrected. The first byte sequence then has a byte which is unequal to the corresponding byte of the second byte sequence. Moreover, there is no error of the error set which corrupts the byte of the corrected second byte sequence to the corresponding byte of the first byte sequence. In that case, no correction that corrects an error of the error set has taken place, and the corrected byte is impermissible. As explained in this example, the second byte sequence is indeed a code word of the error code, but a code word which does not result from the first byte sequence on the basis of a correction of an error of the error set. The second byte sequence is therefore impermissible. Consequently, without using a further check byte it is possible to recognize that more errors than would be correctly correctable by the error code have occurred.

If a corrected byte is an impermissible byte, the corrected impermissible byte differs from the corresponding first byte by an error which is not an error of the error set. This may apply if an error which is not correctable by the error code and leads to a false correction has occurred in the first byte sequence.

It should be noted here that the false correction arises by virtue of the fact that the error code can only correct a limited amount of errors. If the error code is a 1-byte-error-correcting code, for example, only a single byte can be (correctly) corrected. By contrast, if there are at least two erroneous bytes, the error code corrects nevertheless (after all, the error code does not know how many errors have occurred), possibly however a non-erroneous byte at the incorrect position, and yields a code word of this error code as the result of the correction. From the "viewpoint" of the error code, the correction is thus concluded, even though a false correction is actually involved. The prior art uses additional check bytes in order to avoid such false corrections: by means of the check bytes, prior to the correction it is possible to establish whether a 1-byte error is actually present. Only in that case is use made of the 1-byte-error-correcting code.

Advantageously, the present approach enables such check bytes to be saved because the false correction is detected in a different way than in the prior art. In the present example, the 1-byte-error-correcting code carries out the correction irrespective of whether a 1-byte error or a 2-byte error is present. In the case of a 2-byte error, the code corrects an incorrect byte (i.e. a byte at the incorrect place) with the incorrect value. In the approach described here, this incorrect value is detected by virtue of an impermissible correction having taken place: an error set is determined in order, on the basis of the error set, to be able to differentiate permissible corrections from impermissible corrections and thus to identify false corrections. Advantageously, no further check byte is required for this purpose.

If a byte of the first byte sequence is replaced with a corrected byte which is different from the first byte, then it is determined whether the second byte is a permissible byte. It is determined whether there is an error of the error set which corrupts the second byte to the first byte. If that is the case, then the second byte is permissible. If that is not the case, then the second byte is impermissible and the byte of the second byte sequence is still erroneous even after it replaces the byte of the first byte sequence after a correction, for example. A false correction can be detected since no error of the error set has been corrected. The corrected byte cannot have been corrupted to the first byte by an error of the error set.

In this regard, it is possible to detect errors in addition to the properties of the byte error code by virtue of the fact that the corrected bytes determined using a byte error code are impermissible if no error of the error set was corrected. By way of example, that may be the case if the number of byte errors that occurred in the sequence of first bytes exceeds the number of errors that are correctable by the byte error code and a false correction by the byte error code took place.

The error set can be determined on the basis of applications: the error set can comprise such errors which are actually (e.g. physically) possible (or probable). Errors which do not occur (or occur only with a low probability) in real scenarios are not elements of the error set.

If a byte B is corrupted by an error $\varphi$, then an error set $\phi$ to which this error $\varphi$ belongs can be determined. The error set $\phi$ may also be referred to as an error set of a byte or simply as an error set. If a plurality of bytes are present, then the error sets for different bytes may be in each case identical or (at least partly) different from one another.

Byway of example, the error set of a byte may comprise the set of unidirectional errors which corrupt bits of a byte from the value 0 to the value 1. By way of example, the value of a bit may be determined by an electrical charge state of a memory cell, where the magnitude of the charge may decrease over time; on the other hand, it is possible to rule out the charge state rising (or remaining permanently the same), provided that the memory cell is not written to or refreshed.

If the value 0 corresponds to a higher charge and the value 1 to a lower charge, for example, then the value 0 may degenerate to the (incorrect) value 1 over the course of time without the charge being refreshed. Since a spontaneous increase in charge without external action can be (virtually)

ruled out, corruption of the value 1 to the value 0 is ruled out. The errors occurring in this example are thus unidirectional from the value 0 to the value 1.

Example: let there be a byte $$B^2 = 011100 = b_1^2, b_2^2, b_3^2, b_4^2, b_5^2, b_6^2$$

and a byte $$B^1 = 111100 = b_1^1, b_2^1, b_3^1, b_4^1, b_5^1, b_6^1.$$

The error set φ comprises unidirectional errors which corrupt the value 0 to the value 1. If the bit $b_1^2=0$ of the byte $B^2$ is corrupted to the value 1, the byte $B^1$ results as a byte determined by a unidirectional bit error of the second byte. Consequently, $B^2$ is a permissible byte.

Let there be a byte $$B^2 = 011100 = b_1^2, b_2^2, b_3^2, b_4^2, b_5^2, b_6^2$$

and a byte $$B^{1'} = 111110 = b_1^{1'}, b_2^{1'}, b_3^{1'}, b_4^{1'}, b_5^{1'}, b_6^{1'}$$

The error set φ shall be the set of unidirectional errors which corrupt at least one 0 to a 1. If the first bit $b_1^2=0$ of the byte $B^2$ and the fifth bit $b_5^2=0$ are corrupted to the value 1, the byte $B^{1'}$ results as a byte determined by a unidirectional bit error, i.e. by an error of the error set φ from the byte $B^2$. Consequently, the byte $B^2$ is a permissible byte.

By way of example, an error set of a k-bit byte may be the set of unidirectional errors which corrupt at most M bits of a byte that assume the value 0 to the binary value 1. The following holds true here: 1≤M≤k.

If first bytes in the error-free case are code words of an m-out-of-n code having m ones and n-m zeros, then read errors may occur during readout from a memory in the time domain. For details regarding readout from memory cells in the time domain, reference should be made to U.S. Pat. No. 9,805,771 B2, for example: in that case, a read current formed during readout as a function of a resistance value stored in the memory cell is integrated in a capacitor. The memory cells that reach a specific voltage of the capacitor the most rapidly in the temporal order may each be assigned the value 1, and the cells that reach the specific voltage the most slowly may each be assigned the value 0.

During readout of a byte, read errors may occur which corrupt a code word of the m-out-of-n code to a word having m+1 ones and n−m−1 zeros.

A further one is added to the correctly present m ones at a bit position which has the value 0 in the error-free case. Here as well this is a unidirectional error in which a binary value 0 is corrupted to the binary value 1. If the dependence of the various possible errors on the specific byte B is to be specified, then the error set is designated by φ(B).

The error set φ may also be determined as the error set in a k-bit byte in which a specific number M*of binary values are corrupted to their inverse value (0 is the inverse of 1, and vice versa). It is the case here that 1≤M*≤k. If M*=1, for example, then there are bidirectional 1-bit errors that can cause the value 0 to be corrupted to the value 1, or the value 1 to be corrupted to the value 0.

If one code word of an m-out-of-n code is corrupted to another code word of this code, then an even number of ones are changed and, in this example, the error set CD may be the set of all possible even errors (i.e. the set of errors in which an even number of bits are erroneous).

Reed-Solomon Code for 1-Byte Error Correction

By way of example, consideration will be given to the error correction of byte errors using a Reed-Solomon code over a Galois field GF($2^r$) where r=3 for 1-byte error correction. The Galois field GF($2^3$) has 8 elements, which are specified in an exponential representation as $0, \alpha^0, \alpha^1, \alpha^2, \alpha^3, \alpha^4, \alpha^5, \alpha^6$ In this case, $\alpha^1=\alpha$ is a generating element of the GF($2^3$).

Moreover, these 8 elements of the Galois field GF($2^3$) may be represented in their vector representation as 3-component binary vectors and in these terms they each describe a byte composed of 3 bits. An element of the Galois field GF($2^3$) in its vector representation as a 3-dimensional binary vector then represents a 3-bit byte.

The relationship between the exponential representation and the vector representation is shown by Table 1.

TABLE 1

| Representations of the elements of the Galois field | |
|---|---|
| Exponential representation | Vector representation |
| 0 | 000 |
| $\alpha^0$ | 100 |
| $\alpha^1$ | 010 |
| $\alpha^2$ | 001 |
| $\alpha^3$ | 110 |
| $\alpha^4$ | 011 |
| $\alpha^5$ | 111 |
| $\alpha^6$ | 101 |

Multiplication and division of the elements $\alpha^i$ and $\alpha^j$ are defined by:

$$\alpha^i \cdot \alpha^j = \alpha^{[i+j] mod 7}$$

$$\frac{\alpha^i}{\alpha^j} = \alpha^{[i-j] mod 7}$$

This results in the following, for example:

$$\alpha^3 \cdot \alpha^5 = \alpha^{8 \; mod \; 7} = \alpha^1$$

$$\frac{\alpha^3}{\alpha^5} = \alpha^{-2 \; mod \; 7} = \alpha^5.$$

The addition is carried out for example as component-by-component modulo 2 addition of the operands in the vector representation. The following thus holds true, for example:

$$\alpha^3 + \alpha^5 = \begin{pmatrix} 1 \\ 1 \\ 0 \end{pmatrix} + \begin{pmatrix} 1 \\ 1 \\ 1 \end{pmatrix} = \begin{pmatrix} 0 \\ 0 \\ 1 \end{pmatrix} = \alpha^2.$$

Furthermore, the elements of this Galois field can be represented as 3×3 matrices. In this regard, reference should be made to [1], for example.

As H-matrix of a 1-byte-error-correcting Reed-Solomon code, the H-matrix $$H = \begin{pmatrix} \alpha^0 & \alpha^1 & \alpha^2 & \alpha^3 & \alpha^4 & \alpha^5 & \alpha^6 \\ \alpha^0 & \alpha^2 & \alpha^4 & \alpha^6 & \alpha^1 & \alpha^3 & \alpha^5 \end{pmatrix} = \begin{pmatrix} H_1 \\ H_2 \end{pmatrix} \quad (1)$$

is used. In this respect, too, reference should be made to [1], where $\alpha^0$ as the unity of the multiplication is designated by 1.

The byte positions are counted starting with 0.

A byte, here a 3-bit byte, may be described as a 3-component binary vector or as an element of the Galois field $GF(2^3)$ in its exponential representation. If a byte is described in binary form as a 3-component binary vector, then the H-matrix according to equation (1) in its binary form is given by $$H = \begin{pmatrix} T^0 & T^1 & T^2 & T^3 & T^4 & T^5 & T^6 \\ T^0 & T^2 & T^4 & T^6 & T^1 & T^3 & T^5 \end{pmatrix} \quad (2)$$

where elements $T^0, \ldots, T^6$ are binary (3×3) matrices, each of which is determined as:

$$T^i = (\alpha^i \alpha^{i+1} \alpha^{i+2}).$$

In this case, $\alpha^i$, $\alpha^{i+1}$ and $\alpha^{i+2}$ as 3-component column vectors are the corresponding elements of the Galois field $GF(2^3)$ in its vector representation, where it holds true that:

$$T^0 = (\alpha^0 \alpha^1 \alpha^2) = \begin{pmatrix} 1 & 0 & 0 \\ 0 & 1 & 0 \\ 0 & 0 & 1 \end{pmatrix}$$

$$T^1 = (\alpha^1 \alpha^2 \alpha^3) = \begin{pmatrix} 0 & 0 & 1 \\ 1 & 0 & 1 \\ 0 & 1 & 0 \end{pmatrix}$$

$$T^2 = (\alpha^2 \alpha^3 \alpha^4) = \begin{pmatrix} 0 & 1 & 0 \\ 0 & 1 & 1 \\ 1 & 0 & 1 \end{pmatrix}$$

$$T^3 = (\alpha^3 \alpha^4 \alpha^5) = \begin{pmatrix} 1 & 0 & 1 \\ 1 & 1 & 1 \\ 0 & 1 & 1 \end{pmatrix}$$

$$T^4 = (\alpha^4 \alpha^5 \alpha^6) = \begin{pmatrix} 0 & 1 & 1 \\ 1 & 1 & 0 \\ 1 & 1 & 1 \end{pmatrix}$$

$$T^5 = (\alpha^5 \alpha^6 \alpha^0) = \begin{pmatrix} 1 & 1 & 1 \\ 1 & 0 & 0 \\ 1 & 1 & 0 \end{pmatrix}$$

$$T^6 = (\alpha^6 \alpha^0 \alpha^1) = \begin{pmatrix} 1 & 1 & 0 \\ 0 & 0 & 1 \\ 1 & 0 & 0 \end{pmatrix}$$

In this respect, too, reference is made to T. Rao, E. Fujiwara: Error Control Coding for Computer Systems, Prentice Hall, 1989, pages 110 and 111.

For a sequence $$\Lambda = \alpha^{i0}, \alpha^{i1}, \alpha^{i2}, \alpha^{i3}, \alpha^{i4}, \alpha^{i5}, \alpha^{i6}$$

an error syndrome $S=[s_1, s_2]$ having the error syndrome components (also referred to as syndrome components) $s_1$ and $s_2$ is determined as $$s_1 = H_1 \Lambda = \alpha^0 \alpha^{i0} + \alpha^1 \alpha^{i1} + \alpha^2 \alpha^{i2} + \alpha^3 \alpha^{i3} + \alpha^4 \alpha^{i4} + \alpha^5 \alpha^{i5} + \alpha^6 \alpha^{i6} \quad (3)$$

$$s_2 = H_2 \Lambda = \alpha^0 \alpha^{i0} + \alpha^2 \alpha^{i1} + \alpha^4 \alpha^{i2} + \alpha^6 \alpha^{i3} + \alpha^1 \alpha^{i4} + \alpha^3 \alpha^{i5} + \alpha^5 \alpha^{i6} \quad (4)$$

According to Table 1, the triples of the 3-bit bytes in binary form are reversibly uniquely assigned the elements $\alpha^0$ to $\alpha^6$ of the Galois field in their exponential representation and the binary triple 000 is reversibly uniquely assigned the 0 of the Galois field.

If it holds true that $$s_1 = 0, \quad s_2 = 0,$$

then the sequence $\Lambda$ is a code word of the Reed-Solomon code considered.

By way of example, the sequence A with the byte positions 0 to 6

$$\Lambda = \alpha^3 \alpha^6 \alpha^5 \alpha^0 000$$

is a code word since it holds true that:

$$s_1 = H_1 \cdot \Lambda = H_1 \cdot [\alpha^3 \alpha^6 \alpha^5 \alpha^0 000]^T =$$
$$\alpha^0 \alpha^3 + \alpha^1 \alpha^6 + \alpha^2 \alpha^5 + \alpha^3 \alpha^0 = \alpha^3 + \alpha^0 + \alpha^0 + \alpha^3 = 0$$

$$s_2 = H_2 \cdot \Lambda = H_2 \cdot [\alpha^3 \alpha^6 \alpha^5 \alpha^0 000]^T =$$
$$\alpha^0 \alpha^3 + \alpha^2 \alpha^6 + \alpha^4 \alpha^5 + \alpha^6 \alpha^0 = \alpha^3 + \alpha^1 + \alpha^2 + \alpha^6 = 0$$

This sequence A corresponds, according to Table 1, in binary representation, to the sequence of the 3-bit bytes 001 101 111 100 000 000 000.

If, in byte position 3 (corresponding to the fourth byte position from the left), for example, an error occurs which corrupts the byte $$\alpha^0 = 100$$

by a value $$011 = \alpha^4$$

to $$[100] + [011] = \alpha^0 + \alpha^4 = 111 = \alpha^5$$

then the syndrome components $s_1$ and $s_2$ result as $$s_1 = H_1 \cdot [\alpha^3 \alpha^6 \alpha^5 \alpha^0 000]^T =$$
$$\alpha^0 \alpha^3 + \alpha^1 \alpha^6 + \alpha^2 \alpha^5 + \alpha^3 \alpha^5 = \alpha^3 + \alpha^0 + \alpha^0 + \alpha^1 + \alpha^0 \neq 0$$

-continued $$s_2 = H_2 \cdot [\alpha^3 \alpha^6 \alpha^5 \alpha^0 000]^T =$$

$$\alpha^0 \alpha^3 + \alpha^2 \alpha^6 + \alpha^4 \alpha^5 + \alpha^6 \alpha^5 = \alpha^3 + \alpha^1 + \alpha^2 + \alpha^4 + \alpha^3 \neq 0$$

The position of the byte error results as $$\alpha^i = \frac{s_2}{s_1} = \frac{\alpha^3}{\alpha^0} = \alpha^3 \quad (5)$$

Accordingly, byte position 3 is erroneous.

In the case of an error at byte position $\alpha^i$ corresponding to the i-th byte, in which the i-th byte is to be corrected with the value $A_i$ to be corrected, it holds true that $$s_1 = \alpha^i \cdot A_i \text{ and } s_2 = \alpha^{2i} \cdot A_i$$

and thus $$\alpha^i = \frac{s_2}{s_1} \text{ and } A_i = \frac{s_1^2}{s_2}$$

For the specific values $s_1 = \alpha^0$ and $s_2 = \alpha^3$, the following thus results:

$$\alpha^i = \frac{s_2}{s_1} = \frac{\alpha^3}{\alpha^0} = \alpha^3$$

$$A_i = \frac{s_1^2}{s_2} = \frac{\alpha^0}{\alpha^3} = \alpha^{-3 \bmod 7} = \alpha^4$$

The exponents i of $\alpha^i$ should be interpreted modulo 7 here since in the Galois field GF($2^3$) the exponents of a should generally be interpreted modulo ($2^m - 1$).

In the vector representation, $\alpha^4 = 011$, and $\alpha^5 = 111$ with 011 is correctly corrected to $$\alpha^5 + \alpha^4 = 111 + 011 = 100 = \alpha^0$$

The error that has occurred is a unidirectional error that would have corrupted the correct value 100, which also corresponds to the corrected value, at the positions of the two zeros to $111 = \alpha^5$.

The error set determined here is the set of unidirectional bit errors which corrupts a zero erroneously to a one (or a plurality of zeros erroneously to a plurality of ones).

According to the example, the erroneous byte sequence
$\alpha^3 \alpha^6 \alpha^5 \alpha^5$ 000
was corrected to the permissible byte sequence
$\alpha^3 \alpha^6 \alpha^5 \alpha^0$ 000

There is an error of the error set, specifically the unidirectional error with the error value $A_3 = 011 = \alpha^4$, which corrupts the byte 100 in byte position 3 to $111 = \alpha^5$. An error of the error set was thus corrected.

A description is given below of the case where the byte sequence
$\alpha^3 \alpha^6 \alpha^5 \alpha^0$ 000
in byte position 4 with the byte value $110 = \alpha^3$ and in byte position 6 with the byte value $111 = \alpha^5$ is corrupted by two unidirectional errors to the erroneous byte sequence
$\alpha^3 \alpha^6 \alpha^5 \alpha^0 \ \alpha^3 0 \alpha^5$ A 2-byte error thus occurs and the erroneous bits of the bytes have each been corrupted by a unidirectional error from the value 0 to the value 1.

The syndrome components $s_1$ and $s_2$ result as $$s_1 = H_1 \cdot [\alpha^3 \ \alpha^6 \ \alpha^5 \ \alpha^0 \ \alpha^3 \ 0 \ \alpha^5]^T =$$

$$\alpha^0 \alpha^3 + \alpha^1 \alpha^6 + \alpha^2 \alpha^5 + \alpha^3 \alpha^0 + \alpha^4 \alpha^3 + \alpha^6 \alpha^5 = \alpha^7 + \alpha^{11} = \alpha^0 + \alpha^4 = \alpha^5$$

$$s_2 =$$

$$H_2 \cdot [\alpha^3 \ \alpha^6 \ \alpha^5 \ \alpha^0 \ \alpha^3 \ 0 \ \alpha^5]^T = \alpha^0 \alpha^3 + \alpha^2 \alpha^6 + \alpha^4 \alpha^5 + \alpha^6 \alpha^0 + \alpha^1 \alpha^3 + \alpha^5 \alpha^5 =$$

$$\alpha^1 + \alpha^3 + \alpha^2 + \alpha^6 + \alpha^4 + \alpha^3 = \alpha^6$$

A 1-byte correction is effected with the syndrome components $s_1$ and $s_2$. The byte position j to be corrected results from $\alpha^i$ as follows:

$$\alpha^j = \frac{s_2}{s_1} = \frac{\alpha^6}{\alpha^5} = \alpha^1 \quad (7)$$

The byte position is thus 1 and the byte correction value $A_j = A_1$ to be corrected is determined as $$A_j = A_1 = \frac{s_1^2}{s_2} = \frac{\alpha^{10}}{\alpha^6} = \alpha^4 = 011 \quad (8)$$

The corrected byte value in the (erroneously corrected) byte position 1 thus results as $$\alpha^6 + \alpha^4 = 101 + 011 = 110 = \alpha^3.$$

However, this value $\alpha^3 = 110$ cannot be corrupted by a unidirectional error to the value $\alpha^6 = 101$ of the sequence to be corrected and the corrected sequence
$\alpha^3 \alpha^3 \alpha^5 \alpha^0 \alpha^3 0 \ \alpha^5$
determined from the byte sequence
$\alpha^3 \alpha^6 \alpha^5 \alpha^0 \alpha^3 0 \ \alpha^5$
by the 1-bit correction used is impermissible.

Consequently, an erroneous correction, caused by the occurrence of a 2-byte error (which is not correctable with the error code present), can be detected without a further check byte or a further row of the H-matrix being required.
Permissibility of a Second Byte Sequence for False Correction Detection FIG. 1 shows a schematic diagram concerning false correction detection. A first byte sequence
$B_0', B_1', \ldots, B_K'$
is applied to a corrector 101. The corrector 101 enables the correction of a byte error by means of a byte-error-correcting error code. The error code may be a Reed-Solomon code, for example.

On the basis of the first byte sequence, the corrector 101 determines a second byte sequence
$B_0^{cor}, B_1^{cor}, \ldots, B_K^{cor}$.

By way of example, the second byte sequence may be a corrected byte sequence determined using the error code. Furthermore, there is an error set $\phi$.

For the second byte sequence, a check is made in a checking unit 102 to ascertain whether this byte sequence is a permissible byte sequence. This involves checking whether, for the bytes of the second byte sequence which differ from the corresponding bytes of the first byte sequence, there is an error φ of the error set ϕ such that for i=0, . . . , K−1 the error φ of the error set ϕ corrupts the corrected byte $B_i^{cor}$ to the byte $B_i'$.

If that is not the case, the corrected byte sequence $B_0^{cor}$, $B_1^{cor}$, . . . , $B_K^{cor}$ is impermissible since no error of the error set was then corrected. By contrast, if there is such an error of the error set ϕ, then the corrected byte sequence is permissible.

Without further check bytes being required, a possible false correction of the first byte sequence to the second byte sequence can be detected by checking whether the second byte sequence is permissible.

Use of Two Error Codes

By way of example, a first error code and a second (further) error code are used below.

Figure 2:
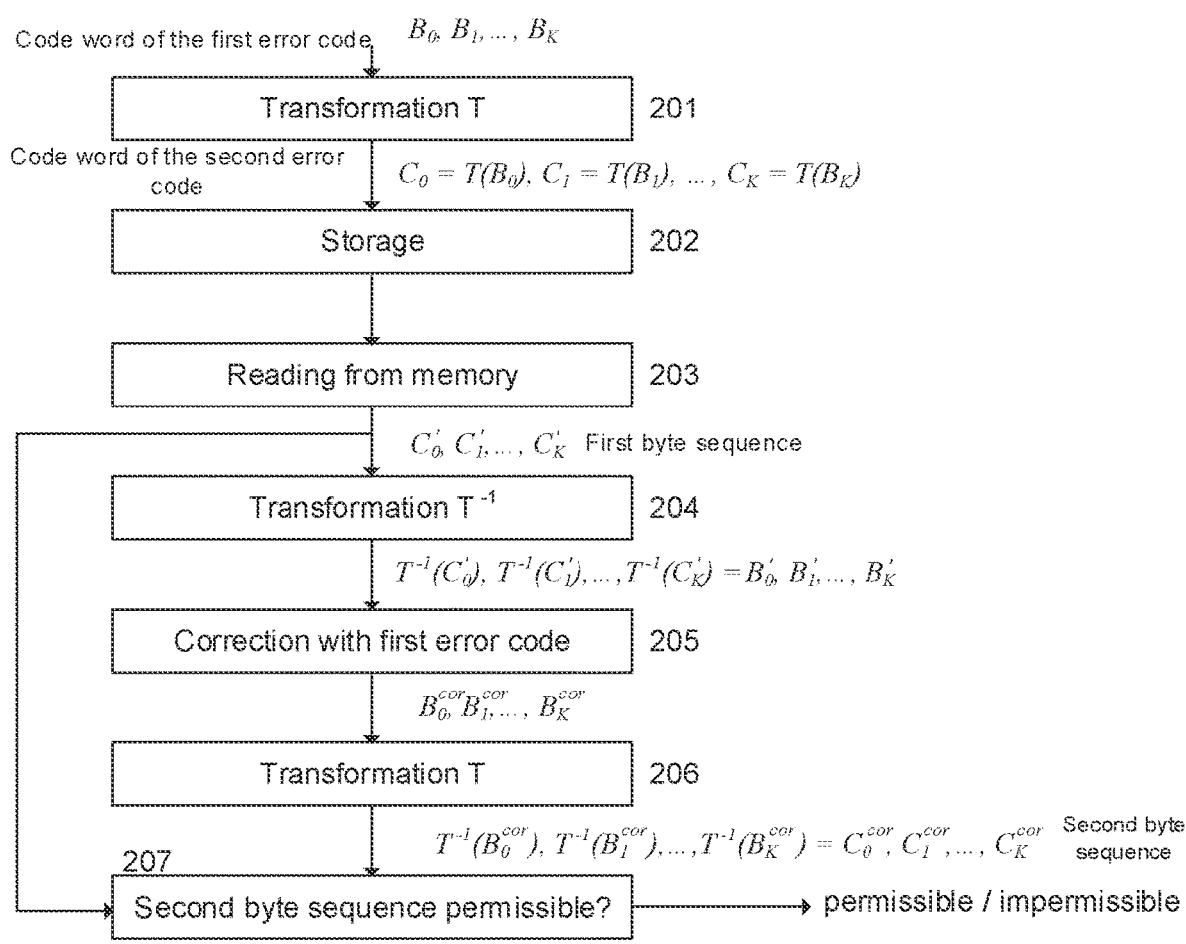
FIG. 2 shows a schematic diagram of an example of false correction detection by means of two error codes, in accordance with various aspects disclosed.

FIG. 2 shows a schematic diagram for elucidating an example of false correction detection by means of two error codes.

A sequence of bytes $B_0, B_1, \ldots, B_K$ forms a code word of the first error code. In this case, a byte $B_i$ comprises k bits (also referred to as a k-bit byte). In a step 201, the k-bit byte $B_i$ is transformed into a code word $C_i$ (i=0, . . . , K) of the second error code with the aid of a transformation T. The transformation T can be determined such that there is an (inverse) transformation $T^{-1}$, such that the following holds true for each transformed k-bit byte $B_i$:

$$T^{-1} = (T(B_i)) = B_i$$

By way of example, the second error code is an m-out-of-n code. The code word $C_i$ of the m-out-of-n code has the length n, has m ones and n−m zeros. The following holds true here: 1≤m≤n. The code words $$C_0 = T(B_0), C_1 = T(B_1), \ldots, C_K = T(B_K)$$

are accordingly n-bit bytes having m ones.

In a step 202, the sequence of code words $C_0$ to $C_K$ is stored in memory cells of a memory.

Errors may occur during storage in the memory and/or during readout from the memory. By way of example, an error set CD is determined, comprising e.g. unidirectional errors.

In a step 203, a first byte sequence $C'_0, C'_1, \ldots, C'_K$ is read from the memory. If $C'_i=C_i$, then the byte i of the first sequence is error-free (or no error detectable by the present error code is present).

By contrast, if an error (φ E C has occurred, then the following holds true for the affected byte i: $C'_i \neq C_i$.

Using the transformation $T^{-1}$, in a step 204, the first byte sequence is transformed into a first transformed byte sequence $$T^{-1}(C'_0), T^{-1}(C'_1), \ldots, T^{-1}(C'_K) = B'_0, B'_1, \ldots, B'_K$$

of k-bit bytes.

All n-bit bytes of the first transformed byte sequence which are not code words of the second error code correspond to an erroneous k-bit byte $B_i'$.

One option, for all n-bit bytes C' which are not code words of the second error code, is to define the inverse transformation $T^{-1}$ as follows:

$$T^{-1}(C^f) = 0.$$

Since the first error code is a byte-correcting code, it determines, if the number of byte errors to be corrected is correctable by the first error code, the correct correction value for an arbitrarily erroneous byte, such that an arbitrarily erroneous byte is correctly corrected independently of its specific erroneous value. It is then advantageous that the erroneous value 0 can be replaced with the correction value, without a logic combination of value to be corrected and correction value being required.

In a step 205, by means of the first error code, the first transformed byte sequence $B_0', B_1', \ldots, B_K'$ is corrected to a corrected sequence $B_0^{cor}, B_1^{cor}, \ldots, B_K^{cor}$ of bytes. The corrected sequence forms a code word of the first error code.

With the aid of the corrected sequence of bytes, in a step 206, a second byte sequence is determined by means of the transformation T according to $$T(B_0^{cor}), T(B_1^{cor}), \ldots, T(B_K^{cor}) = C_0^{cor}, C_1^{cor}, \ldots, C_K^{cor}$$

In this case, the second byte sequence arises as a function of the first byte sequence. The n-bit bytes of the second byte sequence are code words of the second error code.

In a step 207, a check is then made to ascertain whether the second byte sequence constitutes a permissible sequence of bytes: for i=1, . . . , K a check is made for $C_i' \neq C_i^{cor}$ to ascertain whether $C_i^{cor}$ is permissible. This involves determining whether there is an error φ∈ϕ that corrupts $C_i^{cor}$ to $C_i'$. If this is the case, $C_i^{cor}$ is permissible. If this is not the case, $C_i^{cor}$ is impermissible.

If there is a j where 0≤j≤K, such that $C_j^{cor}$ is impermissible, then the second byte sequence is impermissible and the correction is erroneous since no error of the error set ϕ was corrected.

In this case, the readout from the memory cells can be effected in the time domain, for example, as is described in U.S. Pat. No. 9,805,771 B2, for example. In this case, the readout from the memory cells can also be effected using one or more reference values, as is described in DE 10 2020 100 541 A1, for example. Optionally, the readout in the time domain can also be combined with the use of reference values.

If ϕ is the error set of 1-bit errors which corrupt a bit from 0 to 1 or a bit from 1 to 0, then a check is made to ascertain whether $C_i'$ differs from $C_i^{cor}$ in exactly one bit.

If that is the case, an error of the error set was corrected and the corrected byte is regarded as permissible. If that is not the case and $C_i^{cor}$ and $C_i'$ differ in more than one bit in the present case, no error of the error set was corrected, the corrected byte is impermissible and hence the sequence of corrected bytes is also impermissible. An error (i.e. a false correction) is detected. As already explained, such a false correction may occur if the number of erroneous bytes is more than the number that can be correctly corrected by the error code.

An example for k=4 is considered below. There are $2^4=16$ different 4-bit bytes, which are transformed by a transformation T, as presented in Table 2, into a code word of the 3-out-of-6 code. There are $$\binom{6}{3} = 20$$

different code words of the 3-out-of-6 code, 16 of which by way of example are used in the present case (the remaining four code words are not used).

TABLE 2

Exemplary transformation and inverse transformation for k = 4

| | | |
|---|---|---|
| $B_0 = 0000$ | $T(B_0) = 111000 = C_0$ | $T^{-1}(C_0) = B_0$ |
| $B_1 = 0001$ | $T(B_1) = 110100 = C_0$ | $T^{-1}(C_1) = B_1$ |
| $B_2 = 0010$ | $T(B_2) = 110010 = C_0$ | $T^{-1}(C_2) = B_2$ |
| $B_3 = 0011$ | $T(B_3) = 110001 = C_0$ | $T^{-1}(C_3) = B_3$ |
| $B_4 = 0100$ | $T(B_4) = 101100 = C_0$ | $T^{-1}(C_4) = B_4$ |
| $B_5 = 0101$ | $T(B_5) = 101010 = C_0$ | $T^{-1}(C_5) = B_5$ |
| $B_6 = 0110$ | $T(B_6) = 101001 = C_0$ | $T^{-1}(C_6) = B_6$ |
| $B_7 = 0111$ | $T(B_7) = 100110 = C_0$ | $T^{-1}(C_7) = B_7$ |
| $B_8 = 1000$ | $T(B_8) = 100101 = C_0$ | $T^{-1}(C_8) = B_8$ |
| $B_9 = 1001$ | $T(B_9) = 100011 = C_0$ | $T^{-1}(C_9) = B_9$ |
| $B_{10} = 1010$ | $T(B_{10}) = 011100 = C_0$ | $T^{-1}(C_{10}) = B_{10}$ |
| $B_{11} = 1011$ | $T(B_{11}) = 011010 = C_0$ | $T^{-1}(C_{11}) = B_{11}$ |
| $B_{12} = 1100$ | $T(B_{12}) = 011001 = C_0$ | $T^{-1}(C_{12}) = B_{12}$ |
| $B_{13} = 1101$ | $T(B_{13}) = 010110 = C_0$ | $T^{-1}(C_{13}) = B_{13}$ |
| $B_{14} = 1110$ | $T(B_{14}) = 010101 = C_0$ | $T^{-1}(C_{14}) = B_{14}$ |
| $B_{15} = 1111$ | $T(B_{15}) = 010011 = C_0$ | $T^{-1}(C_{15}) = B_{15}$ |

The first column in Table 2 shows the 4-bit bytes $B_0=0000$ to $B_{15}=1111$ and their binary representation. The second column shows the respective 3-out-of-6 code words $C_0, \ldots, C_{15}$ into which the 4-bit bytes of the first column are transformed by means of the transformation T. In this regard, for example, the byte $B_3=0011$ is assigned the code word $T(B_3)=110001=C_3$. The third column presents the (inverse) transformation $T^{-1}$, which assigns the 4-bit byte $B_i$ to the corresponding code word $C_i$ of the 3-out-of-6 code provided that $T(B_i)=C_i$ holds true. By way of example, $T^{-1}(C_3)=B_3$ since $T(B_3)=C_3$ holds true.

During readout, it may happen on account of an error that instead of an n-bit byte which is a code word of the m-out-of-n code, an n-bit byte which is not a code word of the m-out-of-n code is erroneously read. In this regard, (at least) an additional value 1 might be present in the n-bit byte. By way of example, the error set $\phi$ is determined by unidirectional errors that corrupt the value 0 to the value 1. In the present case, a unidirectional 1-bit error occurs on account of the additional value 1. If the byte $C_i \neq C_i^{cor}$ is permissible, then $C_i^{cor}$ and $C_i$ differ in one bit and their component-by-component XOR sum has one 1 and 5 zeros. By contrast, if $C_i^{cor}$ and $C_i$ do not differ in a single bit, then $C_i^{cor}$ is impermissible. If one of the corrected n-bit bytes $C_i^{cor}$ of the second sequence of bytes is impermissible, then the second sequence of bytes is impermissible and the correction does not correct an error of the error set CD.

Exemplary Device

Figure 3:
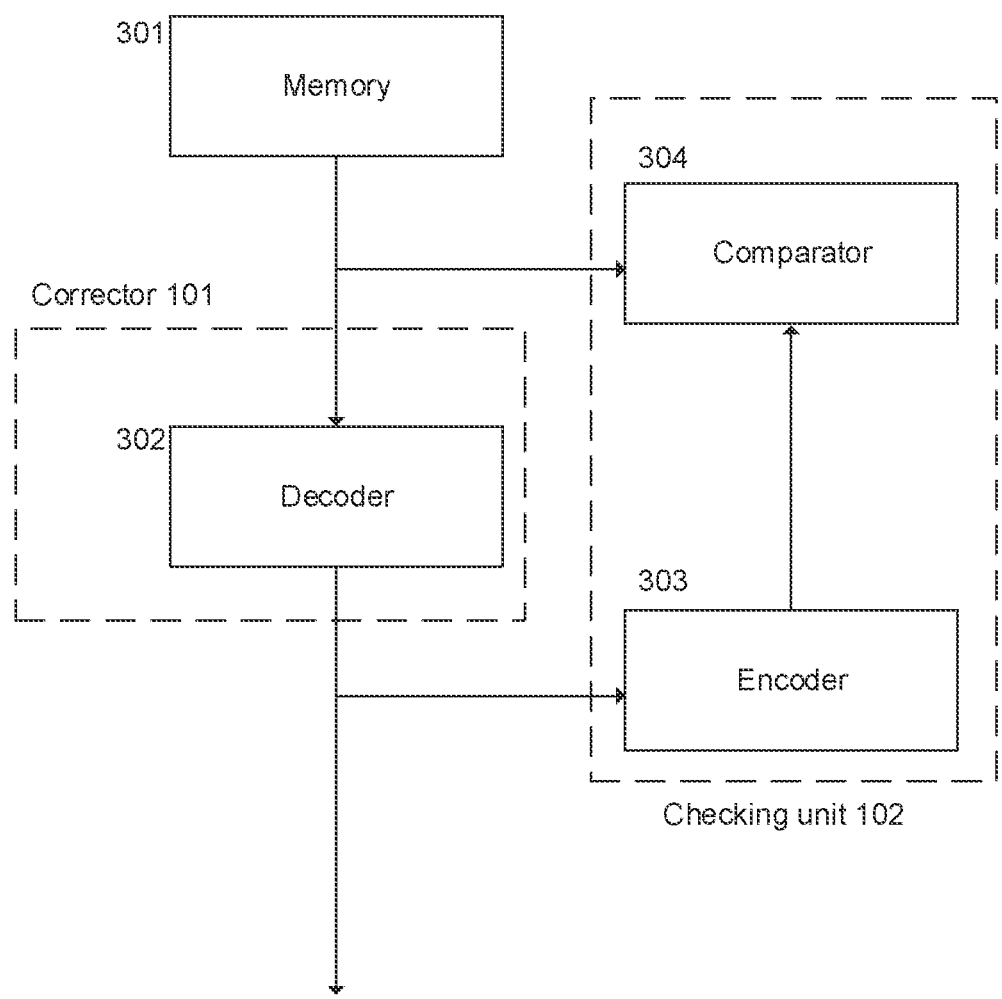
FIG. 3 shows an example device for error detection, in accordance with various aspects disclosed.

FIG. 3 shows an exemplary device for error detection.

Data are read from a memory 301 and, on the basis of the data read, a corrected byte sequence $$B_0^{cor}, B_1^{cor}, \ldots, B_K^{cor}$$

which may possibly be a false correction, is determined by means of the corrector 101 (also cf. FIG. 1). This corrected byte sequence is referred to as second byte sequence in the exemplary embodiment according to FIG. 1. By means of the checking unit 102, a check is made to ascertain whether this second byte sequence is a permissible byte sequence. If the second byte sequence is not a permissible byte sequence, then an error is detected by the checking unit 102, otherwise no error is detected and the second byte sequence can be processed further.

The memory can be for example an RRAM (resistive random access memory).

Optionally, the corrector 101 can be embodied as a decoder 302. In the decoder 302, steps 204 and 205 (cf. FIG. 2 with explanations) can be carried out, resulting in the corrected byte sequence $$B_0^{cor}, B_1^{cor}, \ldots, B_K^{cor}$$

which may possibly be a false correction. This corrected byte sequence is fed to an encoder 303 in the exemplary embodiment according to FIG. 2. The encoder 303 makes it possible for example to carry out the transformation T according to step 206. The output of the encoder 303 is connected to a comparator 304, which also acquires the data read out from the memory. The comparator 304 makes possible the permissibility checking according to step 207. Consequently, according to the exemplary embodiment in FIG. 2 the checking unit 102 comprises the encoder 303 and the comparator 304.

If the corrected byte sequence determined by the decoder 302 is not a permissible byte sequence, then an error is detected by the comparator 304, otherwise no error is detected and the corrected byte sequence can be processed further.

In the exemplary embodiment in FIG. 2, the byte sequence provided to the comparator 304 by the encoder 303 is referred to as second byte sequence.

The encoder 303 is connected to the output of the decoder 302 during a read operation, for example, in order to establish whether the byte sequence determined by the decoder is permissible.

Further Examples and Observations

Byway of example, the functions described herein can be implemented at least partly in hardware, e.g. specific hardware components and/or a processor. In particular, the functions can be realized by means of hardware, processors, software, firmware or any desired combinations thereof.

If implemented in software, the functions can be stored on a computer-readable medium or can be transmitted as one or more instructions or program code and can be executed by a hardware-based processing unit. Computer-readable media can include computer-readable storage media corresponding to physical media, for example data storage media, or communication media comprising an arbitrary medium which makes it possible to transmit a computer program, for example using a communication protocol. In this way, computer-readable media can correspond to physical, non-volatile computer-readable storage media or communication media, for example in the form of signals.

Data storage media can be any available media which can be accessed by one or more computers or one or more processors in order to retrieve instructions, code and/or data structures for implementing the techniques described in this disclosure. A computer program product can include a computer-readable medium.

By way of example, computer-readable storage media can comprise RAM, ROM, EEPROM, CD-ROM, optical disk storage, magnetic disk storage or magnetic storage devices, flash memories or any other medium which can be used to store program code in the form of instructions or data structures which can be accessed by a computer.

Moreover, an arbitrary connection is referred to as a computer-readable medium, that is to say as a computer-readable transmission medium. If, for example, instructions are transmitted from a website, a server or some other remotely arranged source via a connection, e.g. coaxial cable, fiber-optic cable, twisted pair, digital subscriber line (DSL) or wireless technology, e.g. infrared, radio and microwave, then such a connection is part of the definition of the medium.

On the other hand, computer-readable storage media are directed toward physical storage media, e.g. compact disk (CD), laser disk, optical disk, digital versatile disk (DVD), floppy disk and Blu-ray disk. Storage media can be magnetic or optical storage media.

Computer-readable storage media can comprise combinations of the storage media above.

Instructions can be executed by one or more of the following components, for example:
a processor,
a central processing unit (CPU),
a digital signal processor (DSP),
a microprocessor,
an application specific integrated circuit (ASIC),
a field programmable logic array (FPGA),
an integrated logic circuit,
a discrete logic circuit.

Accordingly, the term processor can relate to any of the structures above (including in combination) or any other structure suitable for the implementation.

In addition, the functionality described here can be provided in permanently arranged hardware and/or software modules designed for coding and decoding, or can be integrated in a combined codec. Moreover, the techniques could be fully implemented in one or more circuits and/or logic elements.

The techniques can be implemented in a multiplicity of apparatuses or devices, including a wireless handheld apparatus, an integrated circuit (IC) or a series of integrated circuits, for example also in a chip set. Various components, modules or units are mentioned, also in order to address functional aspects of apparatuses which are configured to implement the solutions described here, but which do not necessarily require a realization by different hardware units. Rather, various units can be combined in a single hardware unit or can be provided by a collection of interoperative hardware units, including one or more processors, as described above, in conjunction with suitable software and/or firmware.

Although various exemplary embodiments have been disclosed, it is evident to a person skilled in the art that various amendments and modifications can be made in order to achieve the advantages of the solutions described here, without departing from the subject matter disclosed herein. In particular, other components which fulfil the same functions can be used in a suitable manner.

It should be pointed out that features explained with reference to a specific figure can be combined with features of other figures, even in the cases where this is not explicitly mentioned. Furthermore, the methods described can be realized either in software implementations through the use of suitable processor instructions or in hybrid implementations which use a combination of hardware and software. Such modifications of the solutions described here are covered by the appended claims.

What is claimed is:

1. A method for error detection, comprising:
reading a first byte sequence from memory;
correcting the first byte sequence based on an error code to generate a second byte sequence;
determining that a byte of the second byte sequence is impermissible when the byte is not equal to an assigned byte of the first byte sequence and if no error of a predefined error set corrupts the byte to the assigned byte of the first byte sequence; and
in response to determining that at least one byte of the second byte sequence is impermissible, providing indication of a false error correction.

2. The method of claim 1, comprising providing the second byte sequence for further processing by a processor in response to determining that the second byte sequence includes only permissible bytes.

3. The method of claim 1, wherein the first byte sequence is a sequence of n-bit bytes, the method comprising
transforming the first byte sequence into a sequence of k-bit bytes using a transformation T−1,
correcting the sequence of k-bit bytes to a corrected sequence of k-bit bytes using the error code,
using a transformation T to transform the corrected sequence of k-bit bytes into the second byte sequence, each byte of the second byte sequence comprising n bits and each byte of the second byte sequence being a code word of a further error code, wherein in error-free bytes of the first byte sequence there are code words of the further error code, and
wherein the transformation T−1 transforms a code word of the further error code into that k-bit byte which is transformed into the code word of the further error code using the transformation T.

4. The method of claim 3, wherein the further error code is an m-out-of-n code.

5. The method of claim 3, wherein the transformation T−1 transforms an n-bit byte which is not a code word of the further error code into a predefined k-bit byte.

6. The method of claim 5, wherein the predefined k-bit byte is the byte.

7. The method of claim 1, comprising determining that a byte of the second byte sequence is impermissible when the difference between the number of ones of a byte of the first byte sequence and the number of ones of the corresponding byte of the second byte sequence is an even number not equal to zero.

8. The method of claim 1, comprising determining that a byte of the second byte sequence is impermissible when the difference between the number of ones of a byte of the first byte sequence and the number of ones of the corresponding byte of the second byte sequence is at most R where R≥1.

9. The method of claim 1, wherein the error set comprises a set of unidirectional errors.

10. The method of claim 9, wherein the error set comprises errors in which at least one bit of a byte is erroneous.

11. The method of claim 1, wherein the first byte sequence comprises bytes which are code words of an m-out-of-n code, where m≤n and n≥2.

12. The method of claim 1, wherein the error code comprises a 1-byte error code and wherein the second byte sequence is determined without separately determining that a 1-byte error is present in the first byte sequence.

13. The method of claim 1, wherein the error code comprises a 1-byte error code and the first byte sequence does not include check bytes for indicating a 1-byte error.

14. A device for error detection comprising
a corrector configured to read data from a memory as a first byte sequence and to correct the first byte sequence to generate a corrected byte sequence; and
a checking unit configured to
determine a byte of a second byte sequence as a function of at least one byte of the corrected byte sequence,
determine a byte of the second byte sequence as impermissible when the byte is not equal to an assigned byte of the first byte sequence and if no error of a predefined error set corrupts the byte to the assigned byte of the first byte sequence,
determine that the second byte sequence is impermissible when at least one byte of the second byte sequence is impermissible; and
detect a false correction in response to the second byte sequence being determined as impermissible.

15. The device of claim 14, wherein
the checking unit comprises an encoder having an input and an output and a comparator having two inputs and an output,
the input of the encoder is connected to the output of the corrector,
the output of the encoder is connected to the first input of the comparator,
the first byte sequence is present at the second input of the comparator,
on the basis of the output of the comparator it is possible to determine whether the second byte sequence is impermissible,
the corrector comprises a decoder configured to
transform n-bit bytes of the first byte sequence into a sequence of k-bit bytes using a transformation T−1, and
correct the sequence of k-bit bytes to the corrected sequence of k-bit bytes using an error code,
the encoder is configured to transform the corrected sequence of k-bit bytes into the second byte sequence using a transformation T, wherein each byte of the second byte sequence comprises n bits and each byte of the second byte sequence is a code word of a further error code, wherein the transformation T−1 transforms a code word of the further error code into that k-bit byte which is transformed into the code word of the further error code using the transformation T, and
the comparator is configured to
determine that the second byte sequence is permissible when the bytes of the first byte sequence are code words of the further error code, and
provide information, at the output of the comparator, that indicates whether or not the second byte sequence is permissible.

16. A false error correction detection system, comprising:
a memory;
a decoder coupled to the memory, configured to
correct a first byte sequence read from the memory based on an error code to generate a corrected byte sequence;
an encoder coupled to the memory and an output of the decoder, configured to
receive the corrected byte sequence; and
transform the corrected byte sequence to generate a second byte sequence; and
a comparator coupled to the memory and the encoder, configured to
receive the second byte sequence from the encoder and the first byte sequence;
compare respective bytes of the second byte sequence to respective corresponding bytes of the first byte sequence; and
provide indication of a false error correction when a pair of corresponding bytes have different values and no error of a predefined error set corrupts the byte of the second byte sequence to the corresponding byte of the first byte sequence.

17. The false error correction detection system of claim 16, wherein
the decoder is configured to
transform n-bit bytes of the first byte sequence into a sequence of k-bit bytes using a transformation T−1, and
correct the sequence of k-bit bytes to the corrected sequence of k-bit bytes using an error code,
the encoder is configured to transform the corrected sequence of k-bit bytes into the second byte sequence using a transformation T, wherein each byte of the second byte sequence comprises n bits and each byte of the second byte sequence is a code word of a further error code, wherein the transformation T−1 transforms a code word of the further error code into that k-bit byte which is transformed into the code word of the further error code using the transformation T, and
the comparator is configured to determine that the second byte sequence is permissible when the bytes of the first byte sequence are code words of the further error code.

18. The false error correction detection system of claim 16, wherein the error code comprises a 1-byte error code and wherein the decoder is configured to correct the first byte sequence without separately determining that a 1-byte error is present in the first byte sequence.

19. The false error correction detection system of claim 16, wherein the error code comprises a 1-byte error code and the first byte sequence does not include check bytes for indicating a 1-byte error.

* * * * *